United States Patent
Tokura et al.

(10) Patent No.: US 9,184,017 B2
(45) Date of Patent: Nov. 10, 2015

(54) FLUORESCENT DISPLAY TUBE WITH TOUCH SWITCH AND METHOD OF FORMING ELECTRODE AND WIRING OF SAME

(71) Applicants: Futaba Corporation, Mobara-shi, Chiba (JP); Taiwan FUTABA Electronics Corporation, Kaohsiung (TW)

(72) Inventors: Katsushi Tokura, Mobara (JP); Ping Ning Chiu, Kaohsiung (TW); Ming Chun Wang, Kaohsiung (TW); Pou Tsen Wang, Kaohsiung (TW); Hung Bin Lin, Kaohsiung (TW)

(73) Assignee: FUTABA CORPORATION, Kaohsiung (TW)

( * ) Notice: Subject to any disclaimer, the term of this patent is extended or adjusted under 35 U.S.C. 154(b) by 186 days.

(21) Appl. No.: 14/026,898

(22) Filed: Sep. 13, 2013

(65) Prior Publication Data
US 2014/0091708 A1     Apr. 3, 2014

(30) Foreign Application Priority Data

Sep. 28, 2012  (JP) ................................. 2012-216654

(51) Int. Cl.
| | |
|---|---|
| *H01J 17/12* | (2006.01) |
| *H01J 19/78* | (2006.01) |
| *H01J 9/02* | (2006.01) |
| *H01J 31/12* | (2006.01) |
| *H03K 17/96* | (2006.01) |

(52) U.S. Cl.
CPC . *H01J 19/78* (2013.01); *H01J 9/02* (2013.01); *H01J 17/12* (2013.01); *H01J 31/124* (2013.01); *H03K 17/9622* (2013.01); *H03K 2217/960765* (2013.01); *H03K 2217/960785* (2013.01)

(58) Field of Classification Search
CPC ........... H01J 19/78; H01J 31/124; H01J 9/02; H01J 17/12; H03K 17/9622; H03K 2217/960765; H03K 2217/960785
See application file for complete search history.

(56) References Cited

U.S. PATENT DOCUMENTS

| | | | | |
|---|---|---|---|---|
| 5,463,276 | A  * | 10/1995 | Kawasaki et al. | 313/496 |
| 9,088,283 | B2 * | 7/2015  | Wu et al. | 1/1 |
| 2010/0117977 | A1 | 5/2010  | Yoshino et al. | |

FOREIGN PATENT DOCUMENTS

JP      2010114015 A     5/2010

* cited by examiner

*Primary Examiner* — Jung Kim
(74) *Attorney, Agent, or Firm* — Quarles & Brady LLP

(57) ABSTRACT

An object of the present invention is to provide a fluorescent display tube with a touch switch allowing electrodes such as touch electrode, anode electrode, and wirings thereof to be formed on the same substrate at the same time, and having an easy structure, and to provide a method of forming the electrodes and wirings of the fluorescent display tube. The anode electrodes, the touch electrodes, the shield electrode, and the anode wirings are formed on the front substrate. The shield electrode is formed in between the touch electrodes and the anode electrodes, and in between the touch electrodes and the anode wirings. The shield electrode is made of a continuous single conductive film. The touch electrodes are so formed as to surround the corresponding one of the anode electrodes.

6 Claims, 6 Drawing Sheets

FLUORESCENT DISPLAY TUBE WITH TOUCH SWITCH AND METHOD OF FORMING ELECTRODE AND WIRING OF SAME

CROSS-REFERENCE TO RELATED APPLICATIONS

This application claims the priority benefit of Japanese Patent Application No. 2012-216654 filed Sep. 28, 2012. The contents of which is hereby fully incorporated by reference as if set forth in their entirety herein.

TECHNICAL FIELD

The present invention relates to a fluorescent display tube with a touch switch made by providing a touch electrode of the touch switch on an inner wall of an outer housing composed of a translucent substrate such as glass, and to a method of forming an electrode and a wiring of the fluorescent display tube.

BACKGROUND ART

Conventionally, it has been proposed a fluorescent display tube with a touch panel in which an anode electrode is formed on one substrate of an outer housing made of a glass substrate, and a touch electrode is formed on the other substrate opposite to the one substrate (for example, see PTL 1). The conventional fluorescent display tube with a touch switch will be explained with reference to FIGS. 5A and 5B. FIG. 5A is a plan view viewed in YO direction of FIG. 5B, and showing a positional relationship of electrodes. FIG. 5B is a sectional view taken on line Y1-Y1 in an arrow direction. The outer housing is defined by a front substrate 11 and a rear substrate 12 facing to each other, and a sideboard 13 (side member) interposed between both substrates. An anode electrode 21 is formed on an inner wall of the rear substrate 12. A touch electrode 22 (touch detection electrode) and a dummy electrode 24 are formed on an inner wall of the front substrate 11. Incidentally, a fluorescent film is formed on the anode electrode 21. However, the fluorescent film is omitted in figures. The outer housing is provided with a filament F (cathode) emitting electron as an electron source, a control electrode G, a shield electrode 23, a lead wire 25 for the front substrate, and the like. The shield electrode 23 is interposed between the touch electrode 22 and the filament F.

The anode electrode 21, the touch electrode 22, and the dummy electrode 24 are made of metal film such as aluminum. The touch electrode 22 and the dummy electrode 24 have a slit-shaped opening or are formed in a mesh shape, and thereby they are translucent. The shield electrode 23 and the control electrode G are formed in a mesh shape, and thereby translucent. The anode electrode 21 is so arranged as to be able to display three types of character patterns, HDD, USB, and FD. The touch electrode 22 is so arranged as to be vertically overlapped with the anode electrode 21 which forms various character patterns when viewed in YO direction in FIG. 5B.

Next, an operating principle of a touch switch of the fluorescent display tube with a touch switch shown in FIG. 5 and a control device thereof will be explained with reference to FIGS. 6A and 6B. In FIG. 6A, when a pulse is supplied from a pulse generation circuit 261 to a condenser C, a comparator 262 detects an electrostatic capacity of the condenser C. In this condition, when a finger 263 of an operator touches (approaches) a touch electrode 22, an electrostatic capacity is generated between the touch electrode 22 and the finger 263, and the comparator 262 detects the electrostatic capacity. The comparator 262 generates an output corresponding to imbalance between both electrostatic capacities. Namely, the comparator 262 detects a touch of the finger 263, and generates the output. In FIG. 6B, when the comparator 262 detects the touch of the finger 263, a touch detection switch control section 271 send a control signal corresponding to the touch electrode 22 to a control device 274 and to a display control section 272. The display control section 272 controls lighting on/off of the anode electrode 21 of a display section 273 corresponding to the control signal. Namely, the anode electrode 21 opposite to the touch electrode 22 on which the finger 263 touches is changed lighting on or off.

CITATION LIST

Patent Literature

PTL 1: JP, A, 2010-114015

SUMMARY OF INVENTION

Technical Problem

In the above conventional fluorescent display tube with a touch switch, the touch electrode 22 and the dummy electrode 24 are formed on the front substrate 11, and the anode electrode 21 is formed on the rear substrate 12, respectively. Therefore, it is necessary that the electrodes are formed on both substrates. Resultingly, the number of electrode forming processes is increased, the electrode forming time is increased, and the production cost is increased. Further, a structure of the conventional fluorescent display tube with a touch switch is complex and thereby difficult to be assembled. Further, a gap between the front substrate 11 and the rear substrate 12 is increased, and thereby a thickness of the outer housing is increased. Further, when an operator of the touch switch watches the front substrate 11 in YO direction of FIG. 5B, a positional relationship between the touch electrode 22 and the anode electrode 21 is misaligned unless watching the touch electrode 22 from straight above, and the visibility of the character pattern is reduced. Namely, a viewing angle of the conventional fluorescent display tube with a touch switch is small. For example, when watching the front substrate 11 from obliquely above, the positional relationship of the anode electrode 21 vertically overlapped with the touch electrode 22 is misaligned. Thereby, when the anode electrode 21 (the corresponding touch electrode 22) is expected to be touched, an area on which the touch electrode 22 is not formed is touched, and it cannot be controlled by touch (when a plurality of touch electrodes are formed adjacent to each other, the other touch electrode may be touched). In view of the above problems of the conventional fluorescent display tube with a touch switch, an object of the present invention is to provide a fluorescent display tube with a touch switch allowing electrodes such as touch electrode, anode electrode, and wirings thereof to be formed on the same substrate at the same time, and having an easy structure, and to provide a method of forming the electrodes and wirings of the fluorescent display tube.

Solution to Problem

For attaining the object, according to a first aspect of the present invention, there is provided a fluorescent display tube with a touch switch including: an outer housing defined by front and rear substrates opposite to each other and a sidewall member, wherein an anode electrode, an anode wiring, a touch electrode which defines a pair with the anode electrode, and a shield electrode for electrically shielding the touch electrode from the anode electrode and the anode wiring are formed on the same inner surface of the front substrate and made of the same conductive material. According to a second aspect of the present invention, there is provided the fluorescent display tube with a touch switch as described in the first aspect, wherein the shield electrode is interposed between the anode electrode and the touch electrode and between the anode wiring and touch electrode, and connected to a ground terminal. According to a third aspect of the present invention, there is provided the fluorescent display tube with a touch switch as described in the first or second aspect, wherein the shield electrode is made of a continuous single conductive film. According to a fourth aspect of the present invention, there is provided the fluorescent display tube with a touch switch as described in the first, second, or third aspect, wherein the touch electrode is so formed as to surround the anode electrode. According to a fifth aspect of the present invention, there is provided the fluorescent display tube with a touch switch as described in the first, second, third, or fourth aspect, wherein the anode electrode, the anode wiring, the touch electrode, and the shield electrode are made of metal which is not translucent, and wherein each of the anode electrode and the touch electrode is provided with an opening for passing light therethrough. According to a sixth aspect of the present invention, there is provided a method for forming an electrode and a wiring of a fluorescent display tube with a touch switch including the steps of forming a conductive film on an inner surface of a front substrate of an outer housing defined by the front substrate and a rear substrate opposite to each other and a sidewall member; and etching the conductive film to simultaneously form an anode electrode, an anode wiring, a touch electrode which defines a pair with the anode electrode, and a shield electrode for electrically shielding the touch electrode from the anode electrode and the anode wiring.

Advantageous Effects of Invention

According to the fluorescent display tube with a touch switch of the present invention, because the anode electrode, the anode wiring, the touch electrode, and the shield electrode are formed simultaneously in the same process on the same inner surface of the front substrate with the same metal material, the formation of the electrodes and the anode wiring becomes simple, and the formation time of them can be reduced. Because each electrode of the present invention is formed on the same substrate, the assembling of the outer housing becomes easy without a conventional need of alignment between the touch electrode of the front substrate and the anode electrode of the rear substrate. In the present invention, because the metal films of the anode electrode, the anode wiring, the touch electrode, the shield electrode, terminals, and the like are simultaneously formed by the sputtering or the like, useless metal material which does not contribute to the formation of the metal films can be further reduced than the conventional case that the metal films are formed on different substrates. According to the present invention, because the anode electrode and the touch electrode are formed on the same surface of the same front substrate, a viewing angle becomes wider.

DESCRIPTION OF EMBODIMENTS

A fluorescent display tube with a touch switch according to an embodiment of the present invention will be explained with reference to FIGS. 1 to 3.

Figure 1:
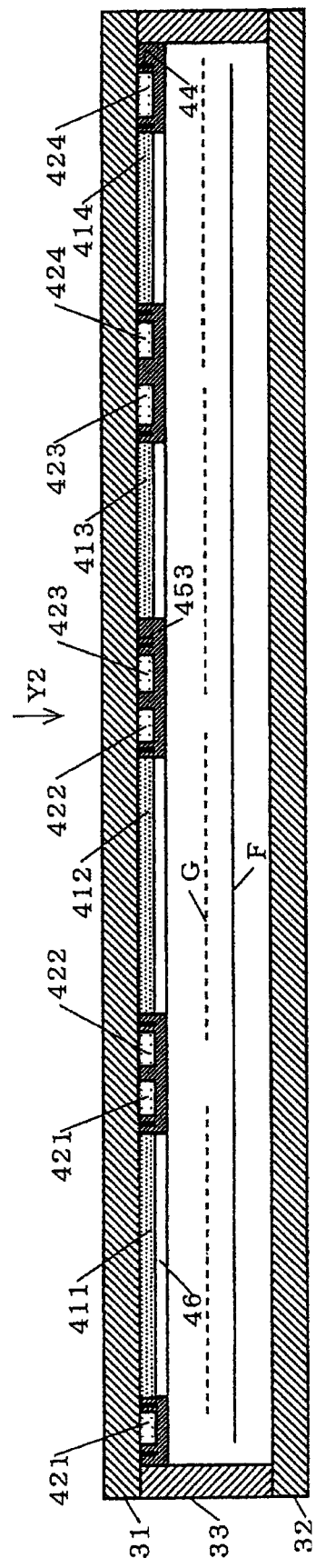
FIG. 1 is a sectional view showing a fluorescent display tube with a touch switch according to an embodiment of the present invention.
Figure 2:
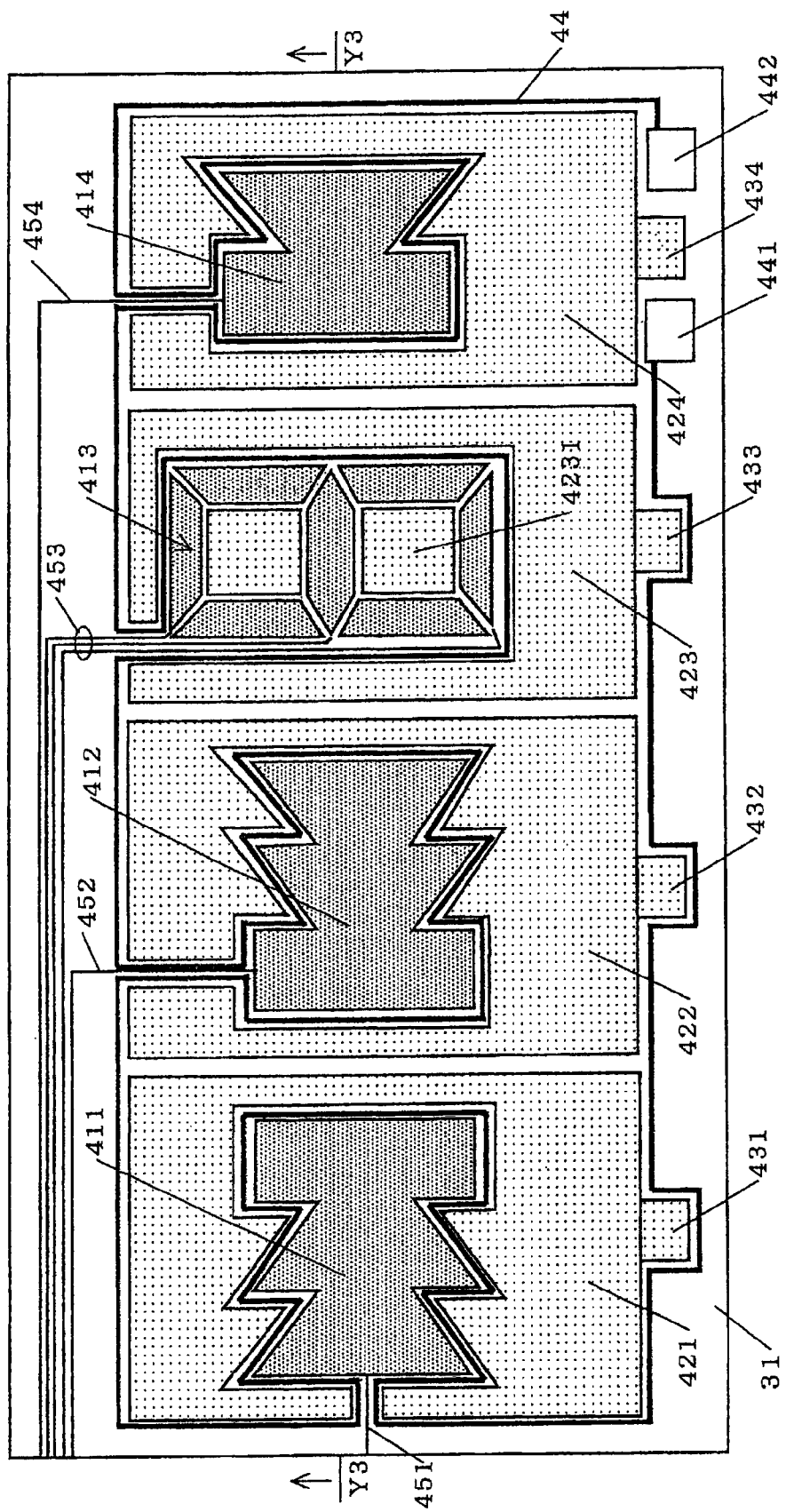
FIG. 2 is a plan view showing a fluorescent display tube with a touch switch according to an embodiment of the present invention.
Figure 3A:
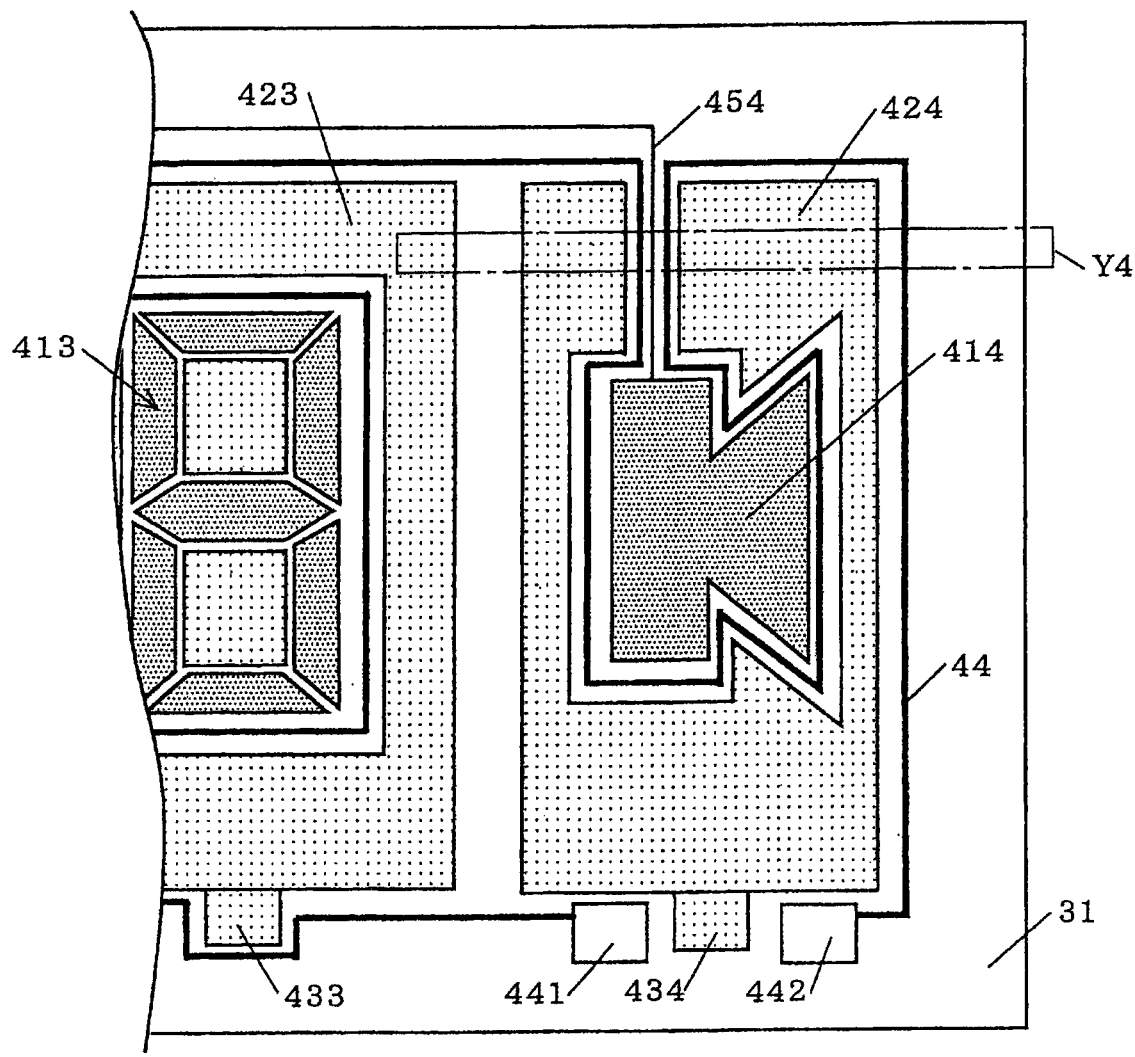
FIG. 3A is an enlarged view of FIG. 2.
Figure 3B:
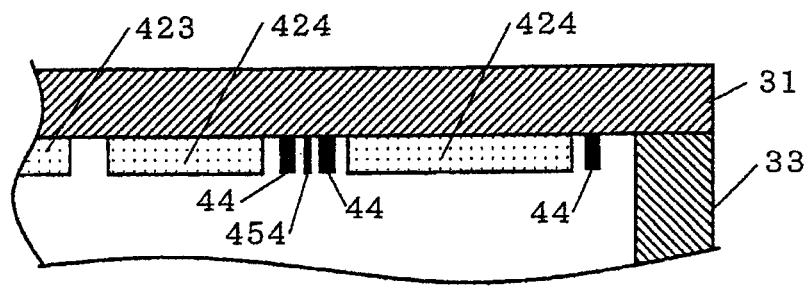
FIG. 3B is an enlarged view of FIG. 1.

FIG. 1 is a sectional view taken on line Y3-Y3 in an arrow direction of FIG. 2. FIG. 2 is a plan view in Y2 direction of FIG. 1. FIG. 3A is a partially enlarged view of FIG. 2. FIG. 3B is a partially enlarged view of FIG. 1. First, FIGS. 1 and 2 will be explained. An outer housing (vacuum airtight container) is made by bonding (sealing) a glass front substrate 31, a glass rear substrate 32, and a glass sidewall 33 (sidewall member) interposed between both substrates with low-melting-point glass (fitted glass). Anode electrodes 411, 412, 413, 414, touch electrodes 421, 422, 423, 424, a shield electrode 44, anode wirings 451, 452, 453, 454 are formed on the same inner surface (a substrate surface or a passivation film of $SiO_x$ formed on the substrate surface) of the front substrate 31. An electron source filament F (cathode), and a control electrode G interposed between the filament F and the anode electrode for controlling the electron emitted from the filament F are arranged in the outer housing. Incidentally, fluorescent films configured to emit light by an impact of the electron emitted from the filament F are formed on the anode electrodes 411 to 414, but they are omitted in figures. Further, the filament F and the control electrode G are respectively attached to support members (not shown) fixed to the front substrate 31. Intransparent insulating layers 46 are formed on the front substrate 31 (on the touch electrodes 421 to 424, the shield electrode 44, and the anode wirings 451 to 454, in between them) except the fluorescent films (including the anode electrodes around them), and thereby the filament and the control electrode G in the outer housing cannot be seen. Because the insulating layers 46 are also formed on the touch electrodes 421 to 424, the shield electrode 44, and the anode wirings 451 to 454, the insulating layers 46 also work as a protective film for reducing changes of the resistance value and the capacitance between electrodes caused by a deposition of Ba (barium) emitted from the filament F on the touch electrodes and between the touch electrodes. The anode electrodes 411 to 414 are respectively connected to the anode wirings 451, 452, 453, and 454. Incidentally, seven wirings for seven segments are formed as the anode wiring 453, however, only three are representatively shown in figures.

In FIG. 2, display patterns displayed by the anode electrodes 411, 412, 414 are respectively a single figure, and a display pattern displayed by the anode electrode 413 is seven segments. The display patterns are not limited to those, and display patterns of figures, characters, numbers, or the like can be formed with one or more anode electrodes. Incidentally, in FIG. 2, the insulating layer 46 shown in FIG. 1 is omitted.

The touch electrodes 421 to 424 are independent from each other, and correspond to the anode electrodes forming the display patterns. For example, the touch electrode 421 corresponds to the anode electrode 411, and the touch electrode 421 and the anode electrode 411 are paired. Similarly, the touch electrode 422 and the anode electrode 412, the touch electrode 423 and the anode electrode 413, the touch electrode 424 and the anode electrode 414 are respectively paired. The touch electrodes 421 to 424 are respectively formed around the anode electrodes 411 to 414 so as to surround each corresponding anode electrode. Namely, the touch electrodes 421 to 424 are formed so as to surround the each anode electrode forming the each display pattern. Therefore, for example, the touch electrode 413 is formed so as to surround the seven anode electrodes 413.

The touch electrodes 421 to 424 are respectively connected to the terminals 431, 432, 433, and 434. Incidentally, touch electrodes 4231 in two O-shaped openings are not used as the touch electrode and connected to the anode electrode 413 or the shield electrode 44 (do not have a touch electrode function). Namely, when a touch electrode having no touch electrode function is provided in an area held between a plurality of anode electrodes (for example, the touch electrode 4231 in the seven segments), the touch electrode is connected to the anode electrode or the shield electrode. The touch electrode 4231 may be connected to the touch electrode 423 and used as a part of the touch electrode 423. In this case, a shield electrode should be arranged in between the seven anode electrodes as the seven segments and the touch electrode 4231. Alternatively, the touch electrodes 421 to 424 may be arranged parallel to the anode electrodes without surrounding the anode electrodes 411 to 414. For example, in FIG. 2, the anode electrodes 411 to 414 and the touch electrodes 421 to 424 may be arranged vertically. Further, in FIG. 2, the touch electrodes are formed corresponding to all of the anode electrodes (display pattern). However, the touch electrodes may be formed corresponding to only required anode electrodes.

The shield electrode 44 is continuously formed in between the touch electrodes 421 to 424 and the anode electrodes 411 to 414, and in between the touch electrodes 421 to 424 and the anode wirings 451 to 454. Namely, the shield electrode 44 is a single metal film continued from the terminal 441 to the terminal 442. Both ends of the shield electrode 44 are connected to the terminals 441, 442 (ground terminals), and both terminals are grounded. Incidentally, the terminals 441, 442 may be any one of two, or more than two. Further, the shield electrode 44 may be split to more than one. In this case, the ground terminal is provided on each of the shield terminals.

A detailed positional relationship among the touch electrodes 421 to 424, the anode electrodes 411 to 414, and the anode wirings 451 to 454 will be explained with reference to FIGS. 3A and 3B. FIG. 3A is an enlarged view of the anode electrodes 413, 414 shown in FIG. 2A. FIG. 3B is a sectional view of Y4 portion shown in FIG. 3A. Incidentally, in FIGS. 3A and 3B, the insulating layer 46 shown in FIG. 1 is omitted. When the shield electrode 44 is in the vicinity of the anode wiring 454, the shield electrode 44 is formed in between the touch electrode 424 and the anode wiring 454, and in between the anode wiring 454 and the touch electrode 424. Further, when the shield electrode 44 is in the vicinity of the anode electrode 414, the shield electrode 44 is formed in between the touch electrode 424 and the anode electrode 414, and in between the anode electrode 414 and the touch electrode 424. When the shield electrode 44 is arranged in between the touch electrodes and the anode electrodes, and in between the touch electrodes and the anode wirings, the touch electrodes, the anode electrodes, and the anode wirings are electrically shielded. Therefore, the touch electrode is prevented from a false operation (false touch detection) generated by receiving an effect of ON/OFF operation of the anode electrode. Incidentally, a width of the shield electrode 44 is 0.3 mm, a distance between the shield electrode 44 and the anode electrodes 411 to 414, and distance between the shield electrode 44 and the anode wirings 451 to 454 are 0.1 mm, a distance between the shield electrode 44 and the touch electrodes 421 to 424 is 0.1 mm.

Figure 6A:
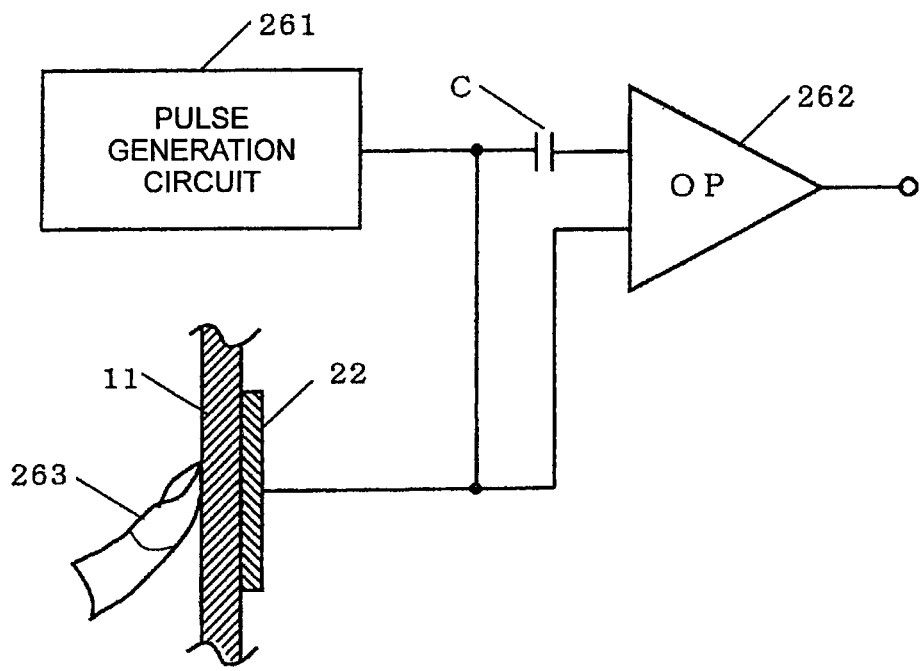
FIG. 6A is a schematic view showing an operating principle of the fluorescent display tube with a touch switch shown in FIG. 5.
Figure 6B:
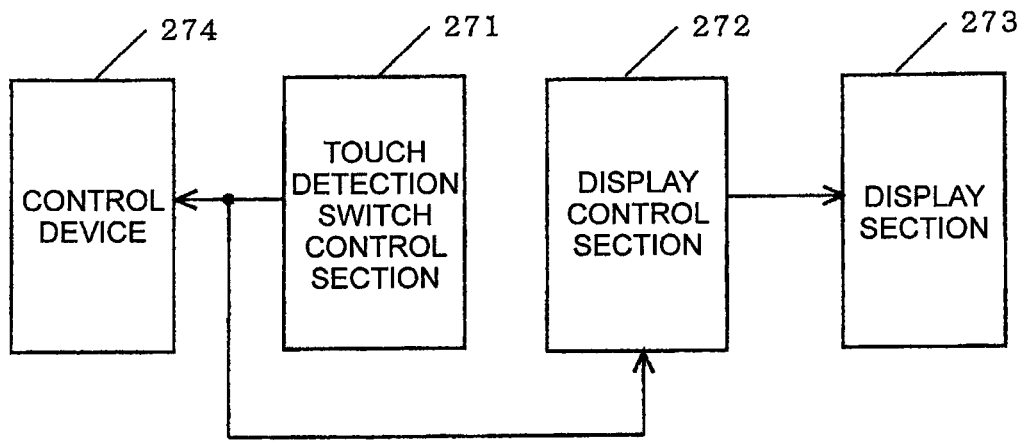
FIG. 6B is a block diagram showing a control device of the fluorescent display tube with a touch switch shown in FIG. 5.

An operation principle of the touch switch of the fluorescent display tube with a touch switch, and a control of the fluorescent display tube with a touch switch by the control device are the same as the conventional fluorescent display tube with a touch switch. For example, when an operator's finger touches (including an approach of the finger) the anode electrode 411 via the front substrate 31, the electrostatic capacity of the touch electrode 421 is changed. This change is detected by the comparator 262 in FIG. 6A, and similar to FIG. 6B, the touch detection switch control section 271 sends the control signal corresponding to the touch electrode to the control device 274 and the display control section 272. The display control section 272 controls lighting on/off of the anode electrode 411. Much the same is true on the other anode electrodes. Incidentally, the anode electrodes 411 to 414 in figures are enlarged. However, for example, a size of the anode electrode 413 of the seven segments is about 8×4 mm. Therefore, when the finger of the operator touches the anode electrodes 411 to 414, the finger simultaneously also touches the touch electrodes 421 to 424. Incidentally, a touch area of an operator's finger is normally a circular shape with about 10 mm diameter. Therefore, a distance from the center of the anode electrode to the touch electrode should be less than the touch area of the finger, namely, less than about 10 mm (when a child touches, less than about 5 mm is preferable).

Figure 4A:
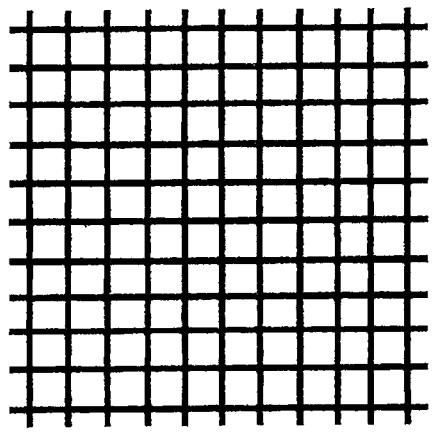
FIG. 4A is a plan view showing an example of a shape of a touch electrode and the like of the fluorescent display tube with a touch switch shown in FIGS. 1 and 2.
Figure 4B:
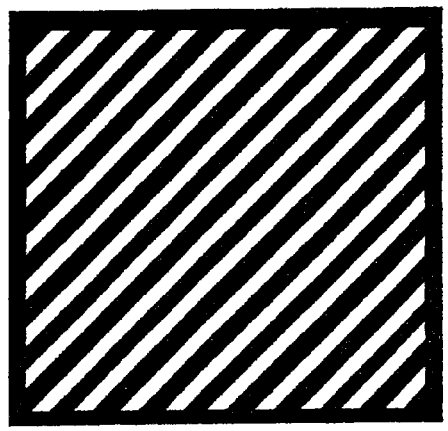
FIG. 4B is a plan view showing another example of a shape of a touch electrode and the like of the fluorescent display tube with a touch switch shown in FIGS. 1 and 2.
Figure 5A:
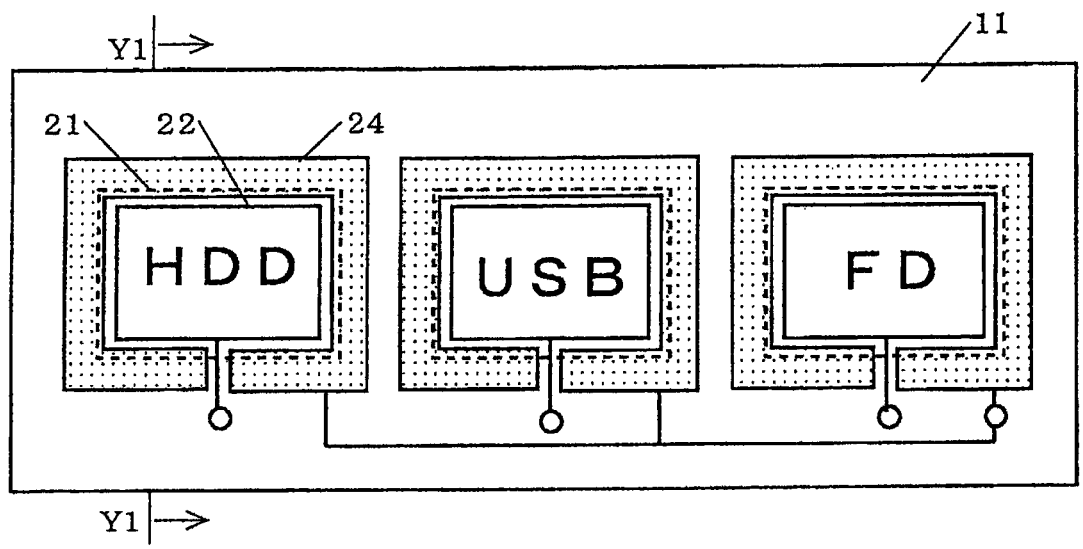
FIG. 5A is a plan view showing a conventional fluorescent display tube with a touch switch.
Figure 5B:
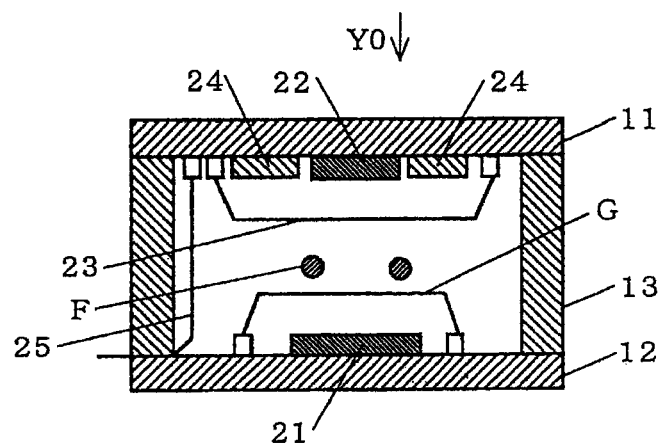
FIG. 5B is a sectional view showing the conventional fluorescent display tube with a touch switch.

When forming the anode electrodes 411 to 414, the anode wirings 451 to 454, the touch electrodes 421 to 424, and the shield electrode 44, firstly, a metal film (conductive film) is formed by sputtering or the like directly on an inner surface of the front substrate 31, or on a passivation film formed on the inner surface of the front substrate 31. Next, the metal film is etched to form the electrodes and the anode wirings. Therefore, the anode electrodes 411 to 414, the anode wirings 451 to 454, the touch electrodes 421 to 424, and the shield electrode 44 can be simultaneously formed with the same metallic material on the same inner surface of the front substrate 31. Incidentally, the terminals 431 to 434, 441, and 442 are also formed simultaneously with the electrodes and the anode wirings. As the metallic material (conductive material), aluminum, niobium, indium tin oxide (ITO) or the like is used. When the metallic material is Intransparent such as aluminum or niobium, the metal film of each electrode is, for example, formed in a mesh shape as shown in FIG. 4A. Alternatively, as shown in FIG. 4B, a slit-shaped opening is formed on the metal film. Thereby, the metal film becomes transparent. The shape of the transparent electrode is not limited to these.

Next, for example, a black insulating layer is formed on the front substrate 31 except the anode electrodes 411 to 414. Further, a fluorescent layer made of ZnO:Zn or the like is deposited on the anode electrodes 411 to 414. Then, the control electrode G and the filament F are arranged opposite to the anode electrodes 411 to 414 on the front substrate 31.

Basically, a production and assembling method is the same as a regular transmission type (surface emitting type) fluorescent display tube. The filament F is formed by depositing electron emission material made of, for example, an oxide of Ba, Sr, and Ca (ternary carbonate of alkali earth metal as a mixture of specific ratio of BaCO3, SrCO3, CaCO3) on a surface of a tungsten core wire or the like having a few or a few dozen micrometer diameter. The control electrode G is a metal mesh made by photo-etching a thin plate of stainless steel or the like into a testudinal shape. Each electrode is electrically connected to each lead terminal projected outward from the outer housing via a not-shown wiring. It is preferable that the touch electrode lead terminal for connecting to the touch electrode is as close as possible to the touch electrode for reducing the electrostatic capacity (when a wiring length is longer, the electrostatic capacity becomes larger). In other words, it is preferable that the touch electrode is connected to the closest lead terminal.

According to the fluorescent display tube with a touch switch of this embodiment, the anode electrodes 411 to 414, the anode wirings 451 to 454, the touch electrodes 421 to 424, and the shield electrode 44 are simultaneously formed with the same material on the same inner surface of the front substrate 31. Therefore, the electrodes and the anode wirings are formed in the same process. Therefore, the formation of the electrodes and the anode wirings becomes simple, and the formation time is reduced. Further, according to this embodiment, because the electrodes are formed on the same surface of the same substrate, the assembling of the outer housing becomes easy without a conventional need of alignment between the touch electrode of the front substrate and the anode electrode of the rear substrate. Further, according to this embodiment, because the metal films of the anode electrodes, the anode wirings, the touch electrodes, the shield electrode, terminals, and the like are simultaneously formed by the sputtering or the like, useless metal material which does not contribute to the formation of the metal films can be further reduced than the conventional case that the metal films are formed on different substrates. Further, according to the fluorescent display tube with a touch switch of this embodiment, because the anode electrodes and the touch electrodes are formed on the same surface of the same front substrate, a viewing angle becomes wider.

REFERENCE SIGNS LIST

31 front substrate
32 rear substrate
411 to 414 anode electrode
421 to 424 touch electrode
431 to 434 terminal
44 shield electrode
441, 442 terminal
451 to 454 anode wiring
46 insulating layer
F filament
G control electrode

What is claimed is:

1. A fluorescent display tube with a touch switch, said display tube comprising:
    an outer housing defined by front and rear substrates opposite to each other and a sidewall member, wherein an anode electrode, an anode wiring, a touch electrode which defines a pair with the anode electrode, and a shield electrode for electrically shielding the touch electrode from the anode electrode and the anode wiring are formed on the same inner surface of the front substrate and made of the same conductive material.

2. The fluorescent display tube with a touch switch as claimed in claim 1, wherein the shield electrode is interposed between the anode electrode and the touch electrode and between the anode wiring and touch electrode, and connected to a ground terminal.

3. The fluorescent display tube with a touch switch as claimed in claim 1, wherein the shield electrode is made of a continuous single conductive film.

4. The fluorescent display tube with a touch switch as claimed in claim 1, wherein the touch electrode is so formed as to surround the anode electrode.

5. The fluorescent display tube with a touch switch as claimed in claim 1, wherein the anode electrode, the anode wiring, the touch electrode, and the shield electrode are made of metal which is not translucent, and wherein each of the anode electrode and the touch electrode is provided with an opening for passing light therethrough.

6. A method for forming an electrode and a wiring of a fluorescent display tube with a touch switch, said method comprising the steps of:
    forming a conductive film on an inner surface of a front substrate of an outer housing defined by the front substrate and a rear substrate opposite to each other and a sidewall member; and
    etching the conductive film to simultaneously form an anode electrode, an anode wiring, a touch electrode which defines a pair with the anode electrode, and a shield electrode for electrically shielding the touch electrode from the anode electrode and the anode wiring.

* * * * *